(12) United States Patent
Huisinga et al.

(10) Patent No.: US 8,859,418 B2
(45) Date of Patent: Oct. 14, 2014

(54) METHODS OF FORMING CONDUCTIVE STRUCTURES USING A DUAL METAL HARD MASK TECHNIQUE

(75) Inventors: Torsten Huisinga, Dresden (DE); Jens Hahn, Dresden (DE); Kai Frohberg, Niederau (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/348,256

(22) Filed: Jan. 11, 2012

(65) Prior Publication Data

US 2013/0178057 A1  Jul. 11, 2013

(51) Int. Cl.
 *H01L 21/4763* (2006.01)

(52) U.S. Cl.
 USPC ........................................... 438/633

(58) Field of Classification Search
 CPC .................................... H01L 21/768
 USPC ......... 438/313, 643, 700–702, 600, 633, 636, 438/637, 723, 761; 430/313; 257/301, 306, 257/751
 See application file for complete search history.

(56) References Cited

U.S. PATENT DOCUMENTS

| | | | |
|---|---|---|---|
| 6,177,353 B1 | 1/2001 | Gutsche et al. | |
| 6,191,028 B1 * | 2/2001 | Huang et al. | 438/633 |
| 6,368,979 B1 * | 4/2002 | Wang et al. | 438/723 |
| 6,696,222 B2 * | 2/2004 | Hsue et al. | 430/313 |
| 6,787,054 B2 | 9/2004 | Wang et al. | |
| 7,435,681 B2 | 10/2008 | Lee et al. | |
| 7,592,265 B2 | 9/2009 | Wang et al. | |
| 8,314,031 B2 * | 11/2012 | Hsu | 438/693 |
| 8,716,117 B2 * | 5/2014 | Kim et al. | 438/587 |
| 2001/0041436 A1 | 11/2001 | Parikh | |
| 2003/0044725 A1 * | 3/2003 | Hsue et al. | 430/314 |
| 2003/0064581 A1 * | 4/2003 | Pan et al. | 438/637 |
| 2005/0205519 A1 * | 9/2005 | Kim et al. | 216/67 |
| 2006/0270214 A1 * | 11/2006 | Iba | 438/637 |
| 2008/0020570 A1 * | 1/2008 | Naik | 438/675 |
| 2008/0230516 A1 | 9/2008 | Cho et al. | |
| 2008/0277762 A1 * | 11/2008 | Takewaki et al. | 257/532 |
| 2009/0176378 A1 * | 7/2009 | Wang | 438/761 |
| 2010/0055897 A1 | 3/2010 | Chou et al. | |
| 2010/0184293 A1 * | 7/2010 | Hsu | 438/693 |
| 2012/0129337 A1 * | 5/2012 | Chen et al. | 438/636 |
| 2012/0289043 A1 * | 11/2012 | Hsieh et al. | 438/643 |
| 2012/0309199 A1 * | 12/2012 | Liao et al. | 438/702 |

* cited by examiner

*Primary Examiner* — Vongsavanh Sengdara
*Assistant Examiner* — Ismail Muse
(74) *Attorney, Agent, or Firm* — Amerson Law Firm, PLLC

(57) ABSTRACT

Disclosed herein are various methods of forming conductive structures, such as conductive lines and vias, using a dual metal hard mask integration technique. In one example, the method includes forming a first layer of insulating material, forming a first patterned metal hard mask layer above the first layer of insulating material, forming a second patterned metal hard mask layer above the first patterned metal hard mask layer, performing at least one etching process through both of the second patterned metal hard mask layer and the first patterned metal hard mask layer to define a trench in the first layer of insulating material and forming a conductive structure in the trench.

16 Claims, 5 Drawing Sheets

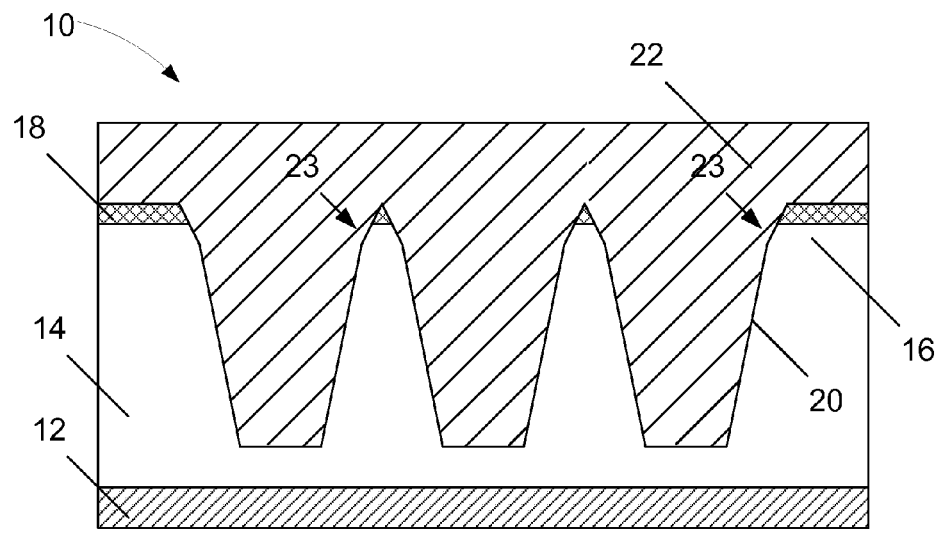
(Prior Art) Figure 1A
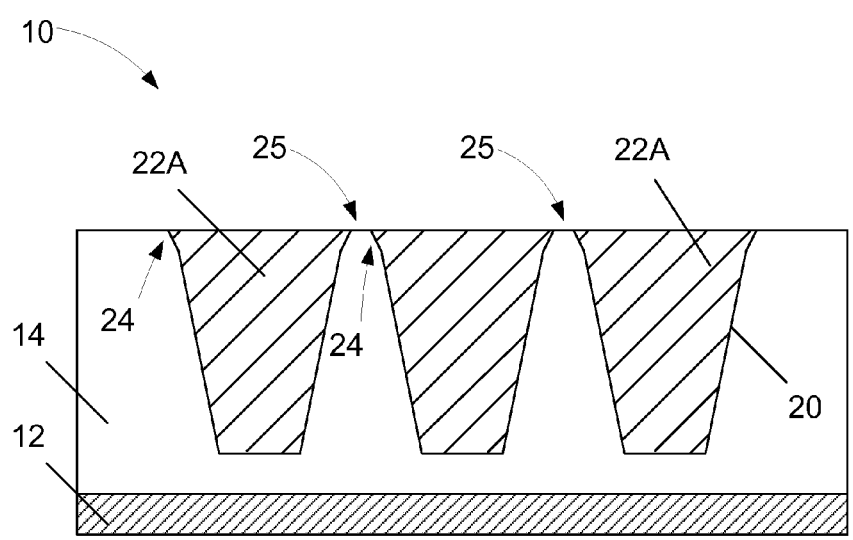
(Prior Art) Figure 1B

METHODS OF FORMING CONDUCTIVE STRUCTURES USING A DUAL METAL HARD MASK TECHNIQUE

BACKGROUND OF THE INVENTION

1. Field of the Invention

Generally, the present disclosure relates to the manufacturing of sophisticated semiconductor devices, and, more specifically, to various methods of forming conductive structures, such as conductive lines and vias, using a dual hard mask integration technique.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit element used in manufacturing such integrated circuit devices. Numerous processing operations are performed in a very detailed sequence, or process flow, to form such integrated circuit devices, e.g., deposition processes, etching processes, heating processes, masking operations, etc.

In modern ultra-high density integrated circuits, device features have been steadily decreased in size to enhance the performance of the semiconductor device and the overall functionality of the circuit. However, commensurate with the ongoing shrinkage of feature sizes, certain size-related problems arise that may at least partially offset the advantages that may be obtained by simple size reduction alone. In general, decreasing the size of, for instance, circuit elements, such as MOS transistors and the like, may lead to superior performance characteristics due to a decreased channel length of the transistor element, thereby resulting in higher drive current capabilities and enhanced switching speeds. Upon decreasing channel length, however, the pitch between adjacent transistors likewise decreases, thereby limiting the size of the conductive contact elements—e.g., those elements that provide electrical connection to the transistor, such as conductive lines and contact vias and the like—that may fit within the available real estate. Accordingly, the electrical resistance of conductive contact elements becomes a significant issue in the overall transistor design, since the cross-sectional area of these elements is similarly decreased. Moreover, the cross-sectional area of the contact vias, together with the characteristics of the materials they comprise, may have a significant influence on the effective electrical resistance and overall performance of these circuit elements. Thus, improving the functionality and performance capability of various metallization systems has become important in designing modern semiconductor devices.

FIGS. 1A-1B depict one illustrative prior art technique for forming conductive structures, such as metal lines, in a layer of insulating material. FIG. 1A depicts a portion of an illustrative metallization layer 10 of an integrated circuit product wherein conductive structures will be formed to establish electrical connection to underlying devices (not shown), such as transistors, capacitors, etc. At the point of fabrication depicted in FIG. 1A, several process operations have been performed. For example, various semiconductor devices (not shown), e.g., transistors, have been formed in and above a semiconducting substrate (not shown). A typical integrated circuit product contains multiple metallization layers. The illustrative metallization layer 10 may be formed at any level of the integrated circuit device.

In the illustrative example depicted in FIG. 1A, the metallization layer 10 is comprised of a cap layer 12, such as NBLOK, a layer of insulating material 14, a metal hard mask layer 18, such as titanium or titanium nitride, and a metal material 22 that is formed in trenches 20 that were formed in the layer of insulating material 14. The metal material 22 is representative in nature in that it may include one or more barrier layers, which are not depicted in FIG. 1A. The various layers of material depicted in FIG. 1A may be comprised of a variety of different materials and they may be formed by performing a variety of known deposition processes. The trenches 20 maybe be formed using known photolithographic and etching tools and techniques. However, by virtue of the etching processes performed in forming the trenches 20, there is a slight outwardly tapered surface 23 of the layer of insulating material 14 proximate the upper surface of the layer of insulating material 14.

As shown in FIG. 1B, a chemical mechanical polishing (CMP) process has been performed to remove the excess metal material 22 positioned outside of the trenches 20 in the layer of insulating material 14 to thereby define conductive structures 22A. However, due to the tapered surface 23 that was formed when forming the trenches 20, the conductive structures 22A exhibit outwardly flared regions 24 that effectively reduce the distance 25 between adjacent conductive structures 22A. Since spacing between adjacent conductive structures in modern integrated circuit devices is already very limited due to high packing density requirements, the flared regions 24 on the conductive structures 22A can be problematic for several reasons. For example, the reduction in separation between adjacent conductive structures due to the presence of the flared regions 24 can lead to many voltage-related dielectric breakdown problems, such as reduced device performance due to an undesirable increase in cross-talk and, in a worst case scenario, electrical shorts which can lead to complete device failure.

The present disclosure is directed to various methods of forming conductive structures using a dual hard mask integration technique that may solve or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming conductive structures, such as conductive lines and vias, using a dual metal hard mask integration technique. In one example, the method includes forming a first layer of insulating material, forming a first patterned metal hard mask layer above the first layer of insulating material, forming a second patterned metal hard mask layer above the first patterned metal hard mask layer, performing at least one etching process through both of the second patterned metal hard mask layer and the first patterned metal hard mask layer to define a trench in the first layer of insulating material and forming a conductive structure in the trench.

Another illustrative method disclosed herein includes the steps of forming a first layer of insulating material, forming a first patterned metal hard mask layer above the first layer of insulating material, forming a second layer of insulating material on the first patterned metal hard mask layer, forming a second patterned metal hard mask layer on the second layer of insulating material, performing at least one etching process through both of the second patterned metal hard mask layer and the first patterned metal hard mask layer to define a trench in the first layer of insulating material and forming a conductive structure in the trench.

BRIEF DESCRIPTION OF THE DRAWINGS

The disclosure may be understood by reference to the following description taken in conjunction with the accompanying drawings, in which like reference numerals identify like elements, and in which:

FIGS. 1A-1B depict one illustrative prior art technique for forming conductive structures in a layer of insulating material.

Figure 2A:
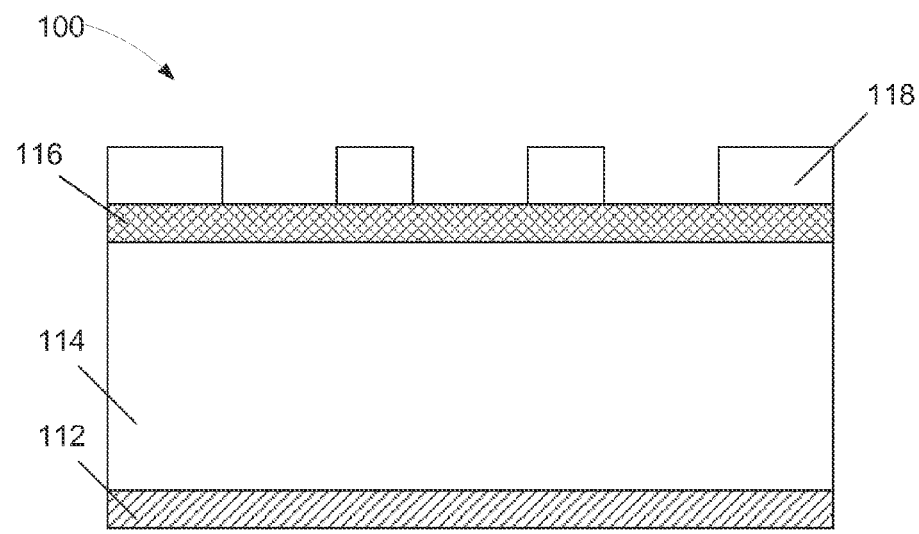
FIGS. 2A-2G depict various novel methods disclosed herein for forming conductive structures, such as conductive lines and vias, using a dual metal hard mask integration technique.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming conductive structures, such as conductive lines and vias, using a dual metal hard mask integration technique. As will be readily apparent to those skilled in the art upon a complete reading of the present application, the present method is applicable to a variety of devices, including, but not limited to, ASICs, logic devices, memory devices, etc. With reference to the attached drawings, various illustrative embodiments of the methods disclosed herein will now be described in more detail.

FIGS. 2A-2G depict various illustrative techniques disclosed herein for forming conductive structures, such as conductive lines and vias, using a dual metal hard mask integration technique. FIG. 2A depicts a portion of an illustrative metallization layer 100 of an integrated circuit product wherein conductive structures will be formed to establish electrical connection to underlying devices (not shown), such as transistors, capacitors, etc. At the point of fabrication depicted in FIG. 2A, several process operations have been performed. For example, various semiconductor devices (not shown), e.g., transistors, have been formed in and above a semiconducting substrate (not shown). A typical integrated circuit product contains multiple metallization layers. The metallization layer 100 described herein may be formed at any level of an integrated circuit device.

In the illustrative example depicted in FIG. 2A, the metallization layer 100 is comprised of a cap layer 112, a first layer of insulating material 114, a first metal hard mask layer 116 and a patterned mask layer 118, such as a patterned photoresist mask layer. The various layers of material depicted in FIG. 2A may be comprised of a variety of different materials and they may be formed by performing a variety of known deposition processes, e.g., physical vapor deposition (PVD), chemical vapor deposition (CVD), atomic layer deposition (ALD) or plasma-enhanced versions of these processes. The patterned photoresist mask layer 118 may be formed using known photolithographic tools and techniques. The cap layer 112 is typically formed over an underlying metallization layer (not shown) to protect that underlying metallization layer during subsequent processing operations. The cap layer 112 may be comprised of a variety of materials, e.g., NBLOK, silicon nitride, Si:C:N:H, HfOx, etc. The layer of insulating material 114 may be comprised of a variety of different materials as well, e.g., silicon dioxide, a so-called low-k material (k value less than 3.7), etc. The first metal hard mask layer 116 may be comprised of a metal or metal alloy, e.g., titanium, titanium nitride, etc., and its thickness may vary depending upon the particular application. In one illustrative embodiment, the first metal hard mask layer 116 may be comprised of titanium or titanium nitride, and it may have a thickness of about 10-30 nm.

Figure 2B:
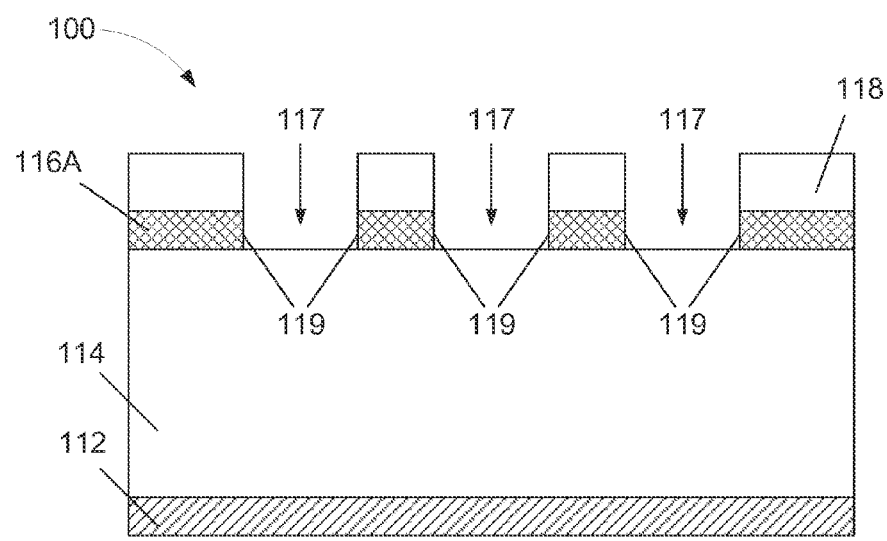

Next, as shown in FIG. 2B, one or more etching processes are performed on the first metal hard mask layer 116 through the patterned mask layer 118 to thereby form a patterned first metal hard mask layer 116A that includes a plurality of openings 117 having lateral sidewalls 119. The size and configuration of the openings 117 in the patterned first metal hard mask layer 116A may vary depending upon the particular application. In some applications, a slight etching of the underlying layer of insulating material 114 may occur to insure complete removal of the desired portions of the first metal hard mask layer 116. However, so as not to obscure the present invention, any such etched regions in the layer of insulating material 114 are not depicted in the attached drawings.

Figure 2C:
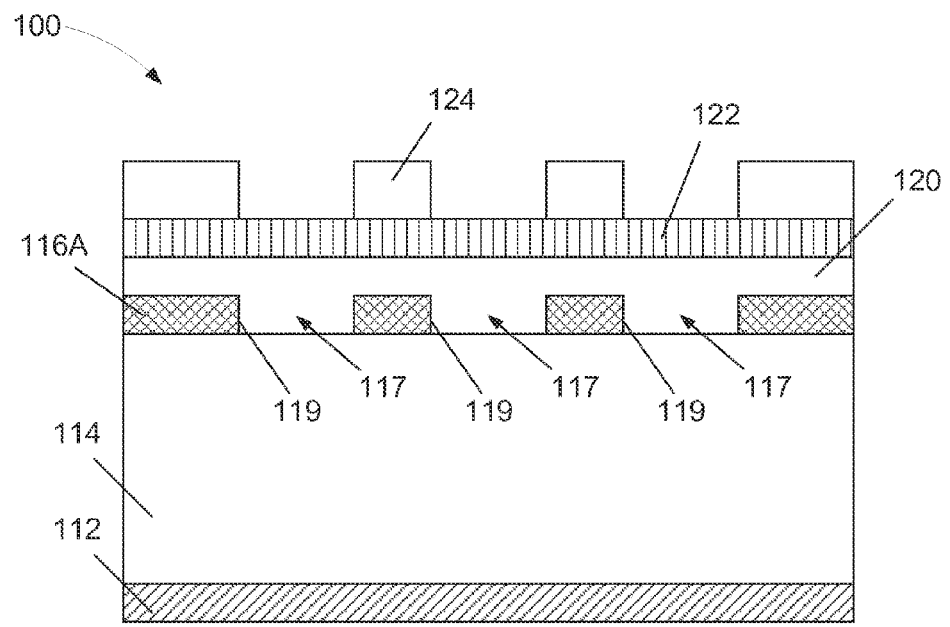

Then, as shown in FIG. 2C, a second layer of instating material 120, a second metal hard mask layer 122 and a patterned mask layer 124, e.g., a photoresist mask, are formed above the patterned first metal hard mask layer 116A. The newly added layers of material depicted in FIG. 2C may be comprised of a variety of different materials and they may be formed by performing a variety of known deposition processes, e.g., PVD, CVD, ALD or plasma-enhanced versions of these processes. The patterned photoresist mask layer 124 may be formed using known photolithographic tools and techniques.

In one illustrative embodiment, the second layer of insulating material 120 may have a thickness of about 10-30 nm and it may be comprised of the same materials as those identified above for the first layer of insulating material 114. In one particularly illustrative embodiment, the second layer of insulating material 120 and the first layer of insulating material 114 may be made of the same insulating material, although that is not required. In one illustrative embodiment, the second metal hard mask layer 122 may have a thickness that ranges from about 10-30 nm, and it may be comprised of the same materials as those identified above for the first metal hard mask layer 116. In one particularly illustrative embodiment, the second metal hard mask layer 122 and the first metal hard mask layer 116 may be made of the same metal material, although that is not required. In one illustrative embodiment, the second metal hard mask layer 122 may be comprised of titanium or titanium nitride.

Figure 2D:
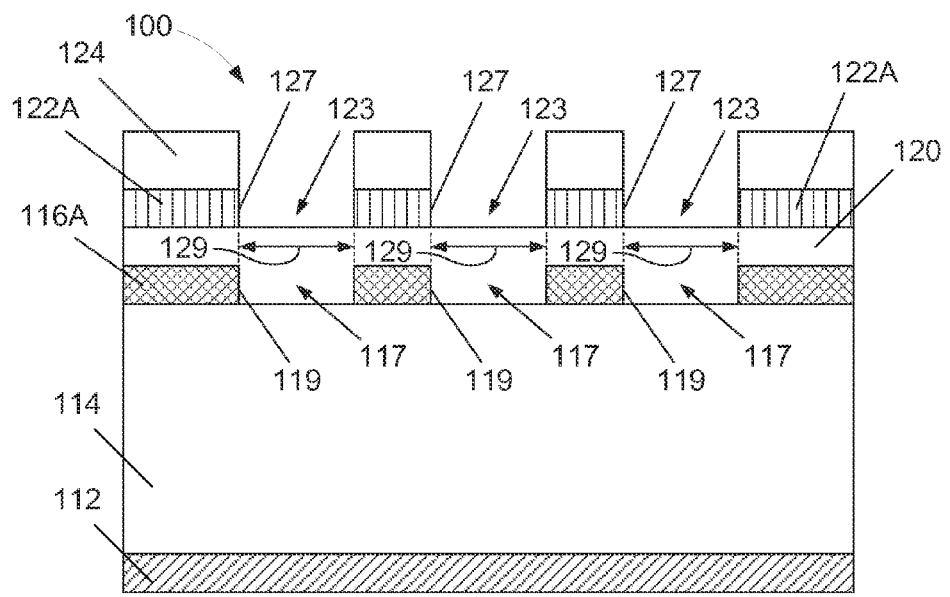

Next, as shown in FIG. 2D, one or more etching processes are performed on the second metal hard mask layer 122 through the patterned mask layer 124 to thereby define a patterned second metal hard mask layer 122A that includes a plurality of openings 123 having lateral sidewalls 127. Furthermore, as shown in FIG. 2D, the patterned second metal hard mask layer 122A may have substantially the same pattern as the patterned first metal hard mask layer 116A. Stated another way, each of the openings 123 in the patterned second metal hard mask layer 122A may be substantially aligned with a corresponding opening 117 in the patterned first metal hard mask layer such that the lateral sidewalls 127 of each opening 123 are substantially in line with the lateral sidewalls 119 of a respective opening 117 and the lateral widths 129 of the respective openings 123 and 117 are substantially the same, as shown in FIG. 2D. Additionally, as noted previously with respect to the openings 117 in the patterned first metal hard mask, the size and configuration of the openings 123 in the patterned second metal hard mask layer 122A may correspondingly vary depending upon the particular application. In some applications, a slight etching of the underlying layer of insulating material 120 may occur to insure complete removal of the desired portions of the second metal hard mask layer 122. However, so as not to obscure the present invention, any such etched regions in the layer of insulating material 120 are not depicted in the attached drawings.

Figure 2E:
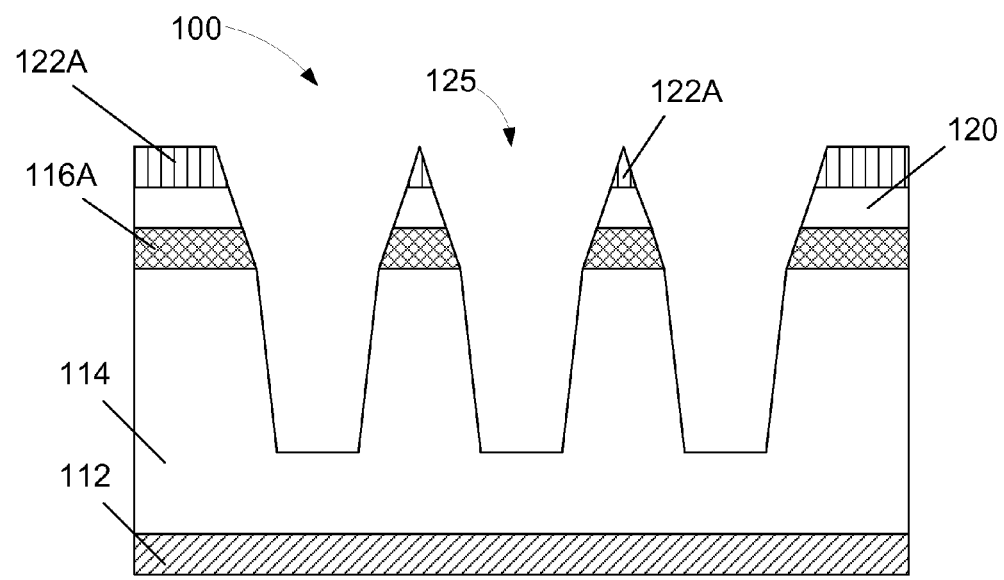

Next, as shown in FIG. 2E, the patterned mask layer 124 may be removed and one or more etching processes may be performed through the patterned second metal mask layer 122A and the patterned first metal hard mask layer 116A to define trenches 125 in the layer of insulating material 114. These etching processes also etch through the second layer of insulating material 120. The etching processes employed may be either a wet or a dry etching process. In one illustrative embodiment, a dry anisotropic etching process is performed to form the trenches 125, with appropriate changes in etch chemistry as required. The size, shape and configuration of the trenches 125 may vary depending upon the particular application.

Figure 2F:
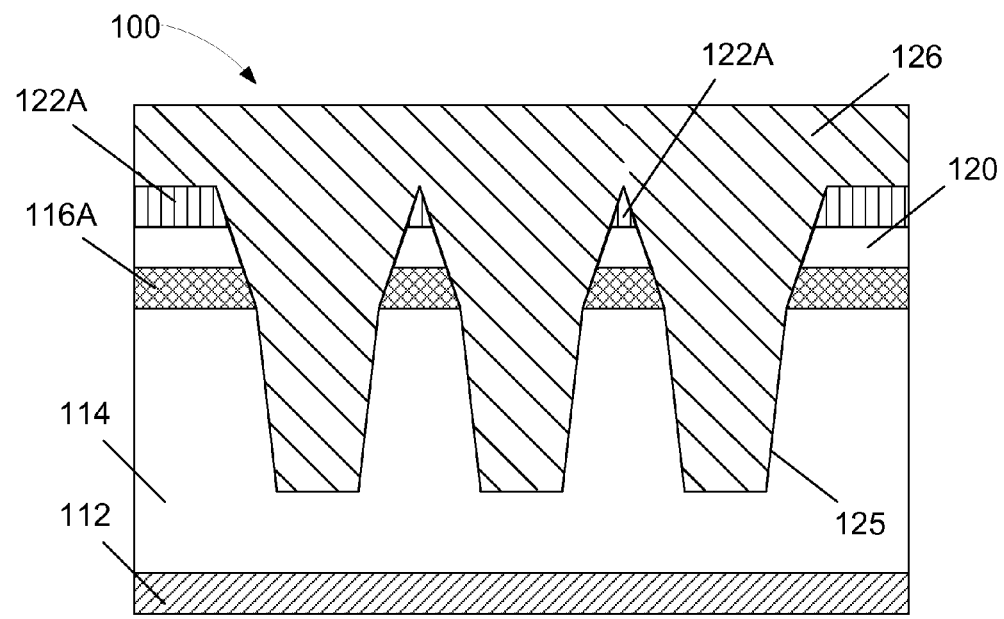

Next, as shown in FIG. 2F, one or more process operations are performed to form a conductive material 126 in the trenches 125 and above the patterned second metal mask layer 122A. The conductive material 126 is intended to be representative in nature in that it may be comprised of any of a variety of different metals, such as, for example, copper, aluminum, tungsten, (or alloys thereof), etc., and it may include one or more barrier layers, which are not depicted in FIG. 2F. The material(s) that make up the conductive material 126 may be formed by performing a variety of known deposition processes, e.g., PVD, electro- and electro-less plating, etc.

Figure 2G:
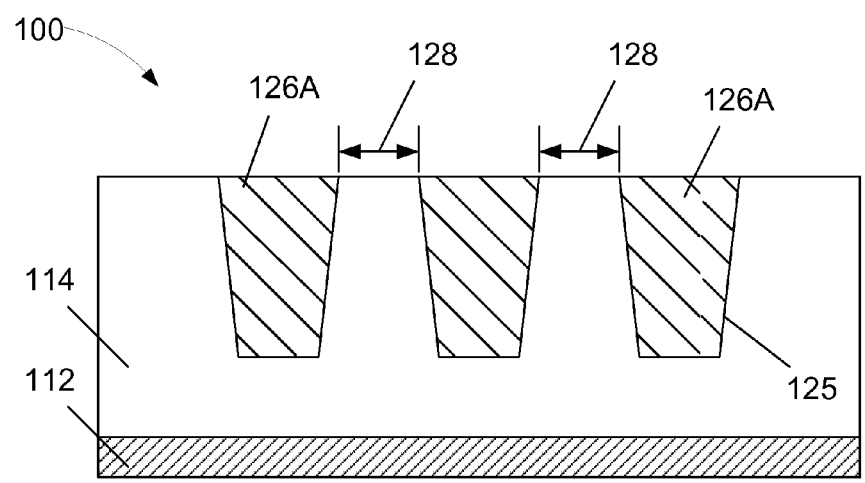

As shown in FIG. 2G, a chemical mechanical polishing (CMP) process is then performed to remove the excess conductive material 126 positioned outside of the trenches 125 in the layer of insulating material 114 to thereby define conductive structures 126A. In the depicted example, this CMP process removes the patterned first metal hard mask layer 116A, the second layer of insulting material 120, and the patterned second metal hard mask layer 122A. Using the techniques disclosed herein, the spacing 128 between adjacent conductive structures 126A may be more uniform and controlled, and the flared regions 24 of the prior art conductive structures 22A shown in FIG. 1B may be eliminated or reduced. Forming the conductive structures 126A using the methods disclosed herein provides for more reliable and predictable spacing between the conductive structures 126A, and thereby reduces the chances of creating short circuits or adversely impacting device performance.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:
1. A method, comprising:
   forming a first layer of insulating material;
   forming a first patterned metal hard mask layer on said first layer of insulating material, said first patterned metal hard mask layer comprising a plurality of first openings that define a first pattern;
   after forming said first patterned metal hard mask layer, forming a second layer of insulating material on said first patterned metal hard mask layer;
   after forming said second layer of insulating material, forming a second patterned metal hard mask layer on said second layer of insulating material above said first patterned metal hard mask layer, said second patterned metal hard mask layer comprising a plurality of second openings that define a second pattern that is substantially the same as and substantially aligned with said first pattern, each of said second openings having lateral sides that are substantially in line with lateral sides of a respective first opening and a lateral width that is substantially the same as a lateral width of said respective first opening;
   performing at least one etching process through said second pattern defined by said second patterned metal hard mask layer, said second layer of insulating material, and said first pattern defined by said first patterned metal hard mask layer, so as to define a trench in said first layer of insulating material; and forming a conductive structure in said trench.

2. A method, comprising:

forming a first layer of insulating material;

forming a first patterned metal hard mask layer on said first layer of insulating material, said first patterned metal hard mask layer comprising a plurality of first openings that define a first pattern;

after forming said first patterned metal hard mask layer, forming a second layer of insulating material on said first patterned metal hard mask layer, wherein said first and second layers of insulating material are comprised of the same material;

after forming said second layer of insulating material, forming a second patterned metal hard mask layer on said second layer of insulating material above said first patterned metal hard mask layer, said second patterned metal hard mask layer comprising a plurality of second openings that define a second pattern that is substantially the same as and substantially aligned with said first pattern, each of said second openings having lateral sides that are substantially in line with lateral sides of a respective first opening and a lateral width that is substantially the same as a lateral width of said respective first opening;

performing at least one etching process through said second pattern defined by said second patterned metal hard mask layer, said second layer of insulating material, and said first pattern defined by said first patterned metal hard mask layer, so as to define a trench in said first layer of insulating material; and forming a conductive structure in said trench.

3. A method, comprising:

depositing a first layer of insulating material;

forming a first patterned metal hard mask layer comprised of titanium nitride on said first layer of insulating material, said first patterned metal hard mask layer comprising a plurality of first openings that define a pattern;

after forming said first patterned metal hard mask layer, forming a second layer of insulating material on said first patterned metal hard mask layer;

after forming said second layer of insulating material, forming a second patterned metal hard mask layer comprised of titanium nitride on said second layer of insulating material above said first patterned metal hard mask layer, said second patterned metal hard mask layer comprising a plurality of second openings that define a second pattern that is substantially the same as and substantially aligned with said first pattern, each of said second openings having lateral sides that are substantially in line with lateral sides of a respective first opening and a lateral width that is substantially the same as a lateral width of said respective first opening;

performing at least one etching process through said second pattern defined by said second patterned metal hard mask layer, said second layer of insulating material, and said first pattern defined by said first patterned metal hard mask layer, so as to define a trench in said first layer of insulating material; and forming a conductive structure in said trench.

4. The method of claim 1, wherein said first patterned metal hard mask layer and said second patterned metal hard mask layer are made of the type of same material.

5. The method of claim 1, wherein said first and second layers of insulating material are comprised of the same type of material.

6. The method of claim 1, wherein forming said conductive structure in said trench comprises:

overfilling said trench with at least one conductive material; and performing at least one chemical mechanical polishing process to remove said first patterned metal hard mask layer, said second patterned metal hard mask layer and portions of said at least one conductive material positioned outside of said trench.

7. The method of claim 1, wherein said conductive structure is comprised of at least one of copper, aluminum or tungsten.

8. The method of claim 1 wherein said first patterned metal hard mask layer and said second patterned metal hard mask layer are comprised of titanium nitride.

9. The method of claim 2, wherein said first patterned metal hard mask layer has a thickness of about 10-30 nm, said second layer of insulating material has a thickness of about 10-30 nm, and said second patterned metal hard mask layer has a thickness of about 10-30 nm.

10. The method of claim 2, wherein said first patterned metal hard mask layer and said second patterned metal hard mask layer are made of the same type of material.

11. The method of claim 2, wherein said first patterned metal hard mask layer and said second patterned metal hard mask layer are comprised of titanium nitride.

12. The method of claim 3, wherein said first patterned metal hard mask layer has a thickness of about 10-30 nm, said second layer of insulating material has a thickness of about 10-30 nm, and said second patterned metal hard mask layer has a thickness of about 10-30 nm.

13. The method of claim 12, wherein said first and second layers of insulating material are comprised of the same type of material.

14. The method of claim 1 wherein said first patterned metal hard mask layer is comprised of a metal or a metal alloy and said second patterned metal hard mask layer is comprised of a metal or a metal alloy.

15. The method of claim 2 wherein said first patterned metal hard mask layer is comprised of a metal or a metal alloy and said second patterned metal hard mask layer is comprised of a metal or a metal alloy.

16. The method of claim 3 wherein said first patterned metal hard mask layer is comprised of a metal or a metal alloy and said second patterned metal hard mask layer is comprised of a metal or a metal alloy.

* * * * *